United States Patent [19]

McAlister et al.

[11] 4,318,014

[45] Mar. 2, 1982

[54] SELECTIVE PRECHARGE CIRCUIT FOR READ-ONLY-MEMORY

[75] Inventors: Doyle V. McAlister, Pflugerville; James R. Pfiester, Austin, both of Tex.

[73] Assignee: Motorola, Inc., Schaumburg, Ill.

[21] Appl. No.: 61,334

[22] Filed: Jul. 27, 1979

[51] Int. Cl.³ .................... H03K 19/096; G11C 8/02
[52] U.S. Cl. .................................... 307/463; 365/104; 365/203; 365/230
[58] Field of Search ............... 307/205, 251, 238, 243, 307/270, DIG. 5, 246, 449, 463; 365/94, 95, 103, 104, 230, 231, 203

[56] References Cited

U.S. PATENT DOCUMENTS

| | | | |
|---|---|---|---|
| 3,611,437 | 10/1971 | Varadi et al. | 307/DIG. 5 X |
| 3,613,055 | 10/1971 | Varadi et al. | 307/DIG. 5 X |
| 3,740,731 | 6/1973 | Ohwada et al. | 307/DIG. 5 X |
| 4,021,781 | 5/1977 | Caudel et al. | 307/205 X |
| 4,094,008 | 6/1978 | Lockwood et al. | 307/238 X |
| 4,139,907 | 2/1979 | Blahut et al. | 365/104 |
| 4,145,759 | 3/1979 | Remedi | 365/103 X |
| 4,183,093 | 1/1980 | Kawagoe | 365/104 |
| 4,185,321 | 1/1980 | Iwahashi et al. | 365/203 X |

Primary Examiner—Larry N. Anagnos
Attorney, Agent, or Firm—Anthony J. Sarli, Jr.; Jeffrey Van Myers; James L. Clingan

[57] ABSTRACT

A read-only-memory circuit is disclosed which includes a plurality of column conductors and circuitry for selecting one of the plurality of column conductors in response to an input address. The selection circuitry couples each of the column conductors to a common node which is coupled to a precharge circuit such that only the selected column conductor is precharged. The precharged circuit includes first and second diode-connected IGFET devices coupled in series such that the first IGFET device is a standard enhancement mode transistor which includes an implanted channel while the second IGFET device is a natural transistor which does not include an implanted channel.

7 Claims, 2 Drawing Figures

SELECTIVE PRECHARGE CIRCUIT FOR READ-ONLY-MEMORY

TECHNICAL FIELD

This invention relates generally to digital circuitry and more particularly to circuitry for selectively precharging one of a plurality of column conductors in a memory or decoder type circuit.

BACKGROUND ART

Integrated circuits composed of insulated-gate-field-effect-transistor (IGFET) devices often employ a dynamic mode of operation in order to save power whereby a node or conductor is precharged to a predetermined voltage during a first time period. During a second subsequent time period, the precharge circuitry is isolated from the precharged node and other circuitry is coupled to the precharged node for selectively discharging the precharged voltage stored thereon. The frequency of operation of the circuitry in this dynamic mode is such that the precharged voltage stored on the node does not have sufficient time to leak off or discharge prior to the next cycle if the circuitry coupled to the precharged node during the second time period does not provide a discharge path. This dynamic mode of operation eliminates D.C. static paths between the power supply conductor ($V_{DD}$) and ground potential, thereby saving power. A read-only-memory (ROM) circuit which employs such a dynamic mode of operation is described in U.S. Pat. No. 4,021,781, invented by Caudel and issued May 3, 1977. In the ROM circuit disclosed by this reference, a plurality of column conductors are precharged, after which time one of the column conductors is selected in response to an input address in order to supply an output signal. As a given circuit may contain a plurality of columns for each output bit, and since the circuitry may simultaneously provide a plurality of output bits in order to make up an output word, the power dissipation which results from precharging each of the column conductors for each output bit may be considerable. Precharging a great number of column conductors simultaneously results in the creation of a relatively large current transient which might possibly disturb the operation of other circuitry on the same integrated circuit chip. Those skilled in the art should appreciate that circuitry which performs the precharge function while significantly reducing the power dissipation associated with the precharging function is a significant improvement over the prior art.

As mentioned above, the output signal generated by this dynamic mode of operation is either the voltage initially precharged on the column conductor or a lesser voltage which results from selectively discharging the precharged column conductor. Thus, the speed with which the output signal can be sensed relates to the time required to discharge the column conductor. If the voltage difference between the initially precharged level and the discharged voltage level is relatively large, then the time required to discharge the column conductor will be significant. However, if the voltage difference between the precharged level and the discharged level is relatively small, then errors are likely to result when attempting to sense which logic level is represented by the voltage on the column conductor. Those skilled in the art should appreciate that precharge circuitry which combines the advantages of rapid discharge time with the advantages of easily distinguishable logic "1" and logic "0" voltage levels is a significant improvement over the prior art.

BRIEF SUMMARY OF THE INVENTION

It is an object of the present invention to reduce the power dissipation and transient current associated with precharging a plurality of column conductors associated with an array type structure such as a read-only-memory circuit.

Another object of the present invention is to control the voltage level to which the column conductors are precharged such that rapid discharge times are possible without destroying the integrity of the output signal generated by the circuit.

These and other objects of the present invention are accomplished by providing a circuit responsive to an input digital signal for generating an output signal which includes a plurality of column conductors, a common node, and circuitry for coupling each of the plurality of column conductors to the common node. The coupling circuitry is responsive to the input digital signal such that only one of the column conductors is selected to be electrically coupled to the common node. A precharge circuit is coupled to the common node for periodically precharging the selected column conductor to a predetermined voltage. Other circuitry is coupled to the plurality of column conductors for selectively discharging the precharged voltage on the selected column conductor in response to the input digital signal. This other circuitry may comprise, for example, the row selection conductors and programmed discharge devices associated with an array type structure such as a ROM circuit. Finally, an output circuit is coupled to the common node for generating the desired output signal. In this manner, only the selected column conductor is precharged, thereby saving power. In the preferred embodiment, the precharge circuitry consists of first and second diode-connected IGFET devices coupled in series between a power supply conductor and the common node such that the first diode-connected IGFET device is a typical enhancement type IGFET device including an implanted channel while the second diode-connected IGFET device is a natural type IGFET device which does not have an implanted channel.

DETAILED DESCRIPTION OF THE INVENTION

Figure 1:
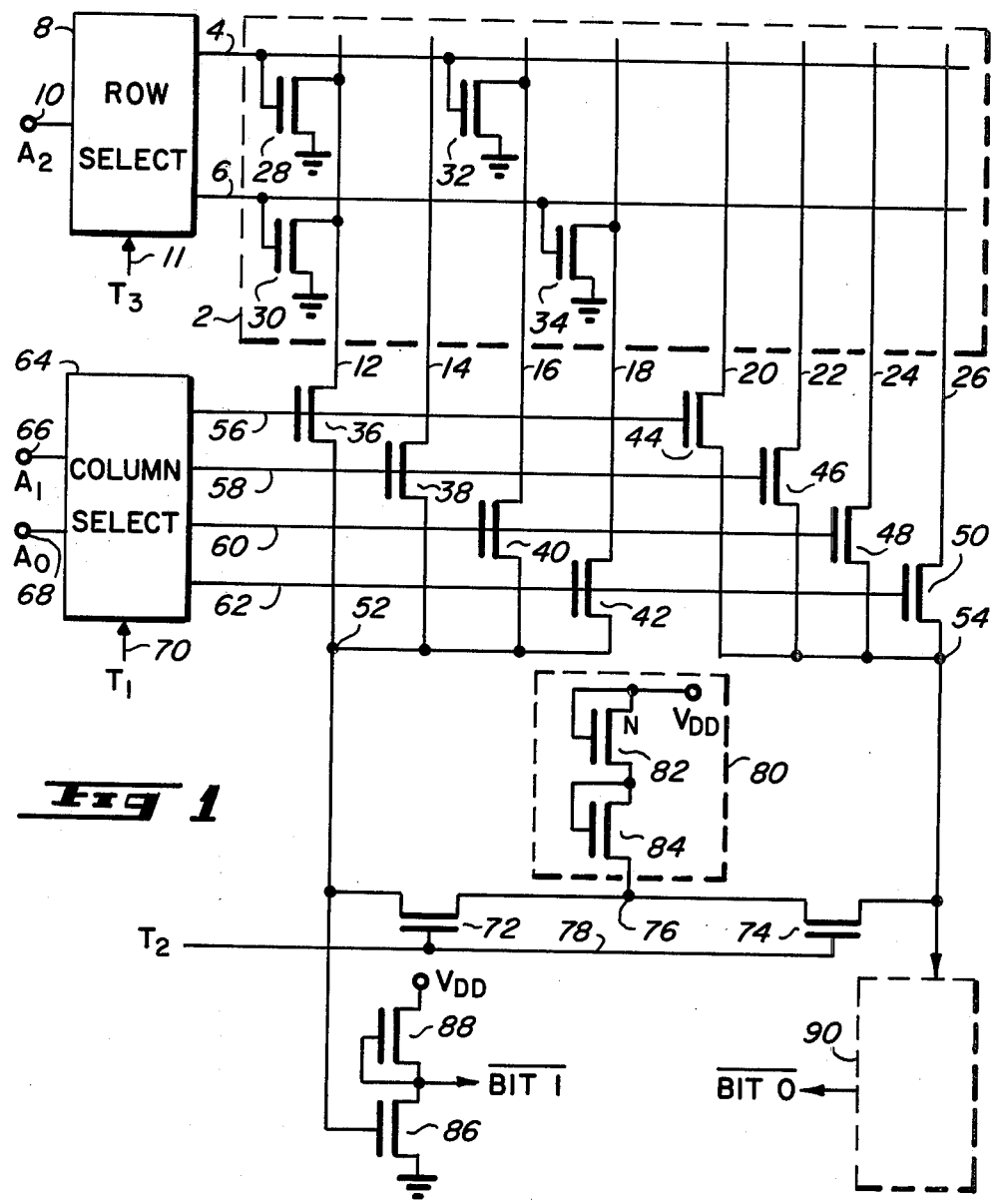
FIG. 1 is circuit schematic of a ROM circuit according to a preferred embodiment of the present invention.

In FIG. 1, a circuit schematic is shown of a ROM circuit constructed according to a preferred embodiment of the invention. Array structure 2 contains the storage elements associated with the ROM circuit. Included within array structure 2 are row conductors 4 and 6. Typically, an array structure for a ROM circuit contains a relatively large number of rows, but only two rows are shown in order to simplify the FIGURE. Rows 4 and 6 are coupled to row select decoder 8 which, in this example, receives a single address input bit $A_2$ on input terminal 10. Row select decoder 8 also receives a timing signal $T_3$ on conductor 11 for enabling one of the row conductors during a third time period as will be explained below.

Array structure 2 also contains a first set of column conductors 12, 14, 16, and 18, and a second set of column conductors 20, 22, 24 and 26. The first and second sets of column conductors are associated with first and second output bits, respectively. Also included within array structure 2 are IGFET devices 28, 30, 32 and 34 which are selectively coupled between the row conductors 4 and 6 and the first set of column conductors 12, 14, 16 and 18. Each of these IGFET devices has its source electrode coupled to ground potential, its gate electrode coupled to one of the row conductors, and its drain electrode coupled to one of the column conductors. If row conductor 4 is at a high level, then IGFET devices 28 and 32 are rendered conductive such that column conductors 12 and 16 are discharged to ground potential. Similarly, if row conductor 6 is at a high level, then IGFET devices 30 and 34 are rendered conductive such that column conductors 12 and 18 are discharged to ground potential. In the example illustrated in FIG. 1, column conductor 12 will always represent a logic "0" since it is discharged regardless of which row conductor is selected. Column conductor 14 will always represent a logic "1" since column conductor 14 will not be discharged regardless of which of the row conductors is enabled. Merely to simplify the FIGURE, no discharge IGFET devices have been illustrated in conjunction with the intersection of row conductors 4 and 6 with the second set of column conductors. However, IGFET discharge devices could be programmed into this portion of the structure in a similar manner.

The first set of column conductors 12–18 is coupled to the drain electrodes of a first set of IGFET devices 36, 38, 40 and 42. Similarly, the second set of column conductors 20–26 is coupled to the drain electrodes of a second set of IGFET devices 44, 46, 48 and 50. The source electrodes of IGFET devices 36–42 are coupled to a common node 52 while the source electrodes of the second set of IGFET devices 44–50 are coupled to a second common node 54. The gate electrodes of IGFET 36 and IGFET 44 are coupled to column select conductor 56. When column select conductor 56 is at a high level, IGFET devices 36 and 44 electrically couple column conductors 12 and 20 to first common node 52 and second common node 54, respectively. Similarly, IGFET devices 38 and 46 have their gate electrodes coupled to column select conductor 58; IGFET devices 40 and 48 have their gate electrodes coupled to column select conductor 60; and, IGFET devices 42 and 50 have their gate electrodes coupled to column select conductor 62.

Column select conductors 56–62 are coupled to column select decoder 64 which receives a first input address bit $A_1$ on terminal 66 and a second input address bit $A_0$ on terminal 68. Column select decoder 64 decodes the input address bits and selects one of the column select conductors 56–62 to a high level. Column select decoder 64 also receives a timing signal $T_1$ on conductor 70 for synchronizing the decoding of the input address bits as will be explained below. The circuitry for constructing row select decoder 8 and column select decoder 64 is well known to those skilled in the art. One possible circuit which may be used for constructing these decoders is described in copending application Ser. No. 61,206, "IGFET Decode Circuit Using Series-Coupled Transistors", filed of even date herewith, invented by the inventors of the present invention and assigned to the assignee of the present invention.

First common node 52 is coupled to the source electrode of IGFET 72 and second common node 54 is coupled to the source electrode of IGFET 74. The drain electrodes of IGFETs 72 and 74 are coupled to node 76. The gate electrodes of IGFETs 72 and 74 are coupled to conductor 78 which conducts timing signal $T_2$. When conductor 78 is at a high level, IGFET devices 72 and 74 are rendered conductive such that node 76 is electrically coupled to first common node 52 and second common node 54.

Since the operation of IGFET devices is well known in the art, they will not be further described herein. Detailed information concerning the operation of these devices is contained in *Physics and Technology of Semiconductor Devices*, by A. S. Grove, John Wiley & Sons, Inc., 1967. Also, those skilled in the art will realize that references to the source and drain electrodes of a particular IGFET device are for purposes of description only since an IGFET device is bidirectionally conductive, and the source and drain electrodes may be interchanged without affecting circuit performance.

Precharge circuit 80 is coupled to node 76 in order to determine the voltage level to which the selected column conductors are precharged. IGFET device 82 has its gate and drain electrodes coupled to a power supply conductor $V_{DD}$ which conducts +5 volts in the preferred embodiment. The source electrode of IGFET device 82 is coupled to the gate and drain electrodes of IGFET device 84, while the source electrode of IGFET device 84 is coupled to node 76.

The precharge voltage generated at node 76 is equal to the power supply voltage $V_{DD}$ less the threshold voltages associated with IGFET devices 82 and 84. Controlling the precharge level for the column conductors in the ROM array structure 2 becomes critical when using minimum size IGFET devices in the ROM to discharge the precharged capacitance associated with the column conductors. IGFET devices 28–34 are preferably designed to be minimum size devices in order to reduce the size of array structure 2. Given a fixed column conductor capacitance and a fixed minimum sized transistor which discharges the column conductor capacitance with a defined peak current, the discharge time for the column conductor can be controlled by altering the precharge voltage level imposed upon the column conductor.

In the preferred embodiment, IGFET device 84 is an enhancement mode transistor while IGFET device 82 is a so-called natural transistor. Typically, enhancement mode transistors are fabricated with an implanted channel between the source and drain electrodes, the implanted channel being of a semiconductor conductivity type opposite to that of the source and drain regions and of the same conductivity type as the semiconductor substrate within which the source and drain regions are formed. The implanted channel typically raises the threshold drop of the IGFET device to the range of 0.9–1.0 volts. On the other hand, a so-called natural transistor is fabricated without the implanted channel between its source and drain regions such that the threshold drop associated with the natural transistor is typically 0.2–0.4 volts. The above mentioned threshold drops assume that a back bias of −2.5 volts exists between the source region of the IGFET device and the substrate. Typically, IGFET circuits are designed with implanted channels such that a gate electrode voltage of greater magnitude is required to render a device conductive, thereby increasing noise immunity. The employment of natural transistor 82 in series with standard enhancement transistor 84 provides a precharge voltage level which is less positive than if a single standard enhancement type transistor were used. Since the selected column conductor is charged to a lower voltage, the selected column conductor can be discharged more quickly. This combination also establishes a more satisfactory logic "1" voltage level on the selected column conductor than if two standard enhancement mode transistors had been used in series.

Also shown in FIG. 1, is an output circuit consisting of IGFET devices 86 and 88. First common node 52 is coupled to the gate electrode of IGFET device 86 which has its source electrode coupled to ground potential. The drain electrode of IGFET device 86 is coupled to an output port $\overline{BIT\ 1}$. IGFET device 88 is a depletion mode device which serves as a load for IGFET device 86 and has its drain electrode coupled to the power supply conductor $V_{DD}$ while its gate and source electrodes are coupled to the drain electrode of IGFET device 86. Second common node 54 is coupled to a similar output circuit represented by block 90 for generating a second output signal $\overline{BIT\ 0}$.

Figure 2:
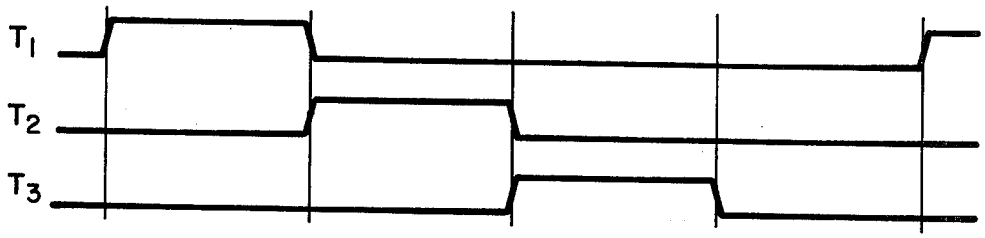
FIG. 2 is a timing diagram for indicating the relative timing of operations performed by the circuitry shown in FIG. 1.

The operation of the circuit can best be described by referring to the timing diagram shown in FIG. 2. During the time that timing signal $T_1$ is at a high level, column select decoder 64 decodes the column address represented by address input bits $A_1$ and $A_0$ and selects one of the four column select conductors 56–62 to a high level. During the time that timing signal $T_2$ is at a high level, precharge circuit 80 is coupled to first common node 52 by IGFET 72 and to second common node 54 by IGFET 74. Assuming that column select conductor 56 is at a high level, then only column conductors 12 and 20 are precharged during time period $T_2$. The remaining column conductors 14–18 and 22–26 are not precharged since they are not electrically coupled to first common node 52 or second common node 54. During time period $T_3$, row select decoder 8 selects one of the two row conductors (4 or 6) to a high level based upon the logic state of input address bit $A_2$ such that the selected column conductor is discharged depending upon whether or not a discharge transistor, such as IGFET device 28, appears in the ROM structure at the intersection of the selected row conductor and column conductor. By the end of time period $T_3$, the selected column conductor will have had sufficient time to discharge such that the output signals ($\overline{BIT\ 1}$, $\overline{BIT\ 0}$) will be stable and can be used by subsequent circuitry (not shown).

Thus, a circuit has been disclosed which reduces the power dissipation associated with precharging the column conductors in a ROM array structure since only one of four column conductors is precharged in the preferred embodiment. Also, a precharge circuit has been disclosed which generates a precharge voltage which can be more quickly discharged yet which is easily distinguished from a discharged voltage level. While the invention has been described with reference to a preferred embodiment, the description is for illustrative purposes only and is not to be construed as limiting the scope of the invention. Various modifications and changes may occur to those skilled in the art without departing from the true spirit and scope of the invention as defined in the appended claims.

We claim:
1. A selective precharge circuit comprising:
  (a) a plurality of conductors;
  (b) a common node;
  (c) coupling means coupled to each of the conductors and to the common node for selectively coupling a selected one of said conductors to the common node when said coupling means is enabled;
  (d) precharge means coupled to the common node for precharging only said selected conductor; and
  (e) a plurality of individually selectable discharge means coupled to each of the conductors, for selectively discharging said selected conductor.

2. A circuit as recited in claim 1 wherein the coupling means comprises:
  (a) a plurality of IGFET devices, each having a gate electrode, a drain electrode coupled to a respective one of the conductors, and a source electrode coupled to the common node; and
  (b) decoding means coupled to the gate electrode of each of the IGFET devices, for rendering conductive a selected one of the IGFET devices.

3. A circuit as recited in claim 1 wherein the precharge means comprises:
  (a) first and second diode-connected IGFET devices coupled in series between a power supply conductor and a precharge node, for generating a predetermined voltage on the precharge node which is less than the voltage on the power supply conductor; and
  (b) a third IGFET device coupled between the precharge node and the common node, for coupling the precharge node to the common node in response to a precharge signal.

4. A circuit as recited in claim 3 wherein the first diode-connected IGFET device is an enhancement type device having a characteristic threshold voltage, and the second diode-connected IGFET device is a natural type IGFET device inherently having a lower characteristic threshold voltage.

5. A selective precharge circuit comprising:
  (a) control means for providing timing signals defining first, second and third time periods;
  (b) a plurality of conductors;
  (c) a common node;
  (d) coupling means coupled to each of the plurality of conductors, for selectively coupling a selected one of the conductors to the common node during the first time period;
  (e) precharge means coupled to the common node, for precharging only said selected conductor during the second time period which follows commencement of said first time period; and
  (f) a plurality of individually selectable discharge means coupled to each of the conductors, for selectively discharging said selected conductor during the third time period which follows commencement of said second time period.

6. A circuit as recited in claim 5 wherein the precharge means comprises:
  (a) first and second diode-connected IGFET devices coupled in series between a power supply conductor and a precharge node, for generating a predetermined voltage on the precharge node which is less than the voltage on the power supply conductor; and
  (b) means coupled between the precharge node and the common node, for coupling the precharge node to the common node during the second time period.

7. A circuit as recited in claim 6 wherein the first diode-connected IGFET device is an enhancement type device having a characteristic threshold voltage, and the second diode-connected IFGET device is a natural type IGFET device inherently having a lower characteristic threshold voltage.

* * * * *